US008331411B2

(12) United States Patent
Schillgalies et al.

(10) Patent No.: US 8,331,411 B2
(45) Date of Patent: Dec. 11, 2012

(54) EDGE-EMITTING SEMICONDUCTOR LASER

(75) Inventors: Marc Schillgalies, Berlin (DE); Stephan Lutgen, Dresden (DE); Uwe Strauss, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/255,632

(22) PCT Filed: Apr. 22, 2010

(86) PCT No.: PCT/EP2010/055364
§ 371 (c)(1),
(2), (4) Date: Nov. 1, 2011

(87) PCT Pub. No.: WO2010/124989
PCT Pub. Date: Nov. 4, 2010

(65) Prior Publication Data
US 2012/0051380 A1    Mar. 1, 2012

(30) Foreign Application Priority Data
Apr. 30, 2009   (DE) .................... 10 2009 019 516

(51) Int. Cl.
*H01S 5/00*   (2006.01)
(52) U.S. Cl. ................................... 372/45.01
(58) Field of Classification Search ................ 372/45.01
See application file for complete search history.

(56) References Cited

U.S. PATENT DOCUMENTS

| 5,189,679 | A |   | 2/1993 | Derry et al. |
| 5,255,333 | A | * | 10/1993 | Althaus et al. ................. 385/33 |
| 6,798,811 | B1 |   | 9/2004 | Sugahara et al. |
| 2002/0141469 | A1 | * | 10/2002 | Yamasaki et al. ............. 372/46 |
| 2003/0052316 | A1 |   | 3/2003 | Nido et al. |

(Continued)

FOREIGN PATENT DOCUMENTS

EP    0854473    7/1998

(Continued)

OTHER PUBLICATIONS

Bour, David P., et al. "Characteristics of INGaN-AlGaN Multiple-Quantum-Well Laser Diodes" *IEEE Journal of Selected Topics in Quantum Electronics*, vol. 4, No. 3 (Jun. 1, 1998) pp. 498-504.
Asano, Takeharu, et al. "Over 100-m W blue-violet laser diodes for Blue-ray Disc system" *Proc. of SPIE*, vol. 5365 (SPIE, Bellingham, WA, 2004) 0277-786X04, pp. 297-305, May 4, 2011.

(Continued)

*Primary Examiner* — Patrick Stafford
(74) *Attorney, Agent, or Firm* — Occhiuti Rohlicek & Tsao LLP (57) ABSTRACT

The invention relates to an edge-emitting semiconductor laser comprising a semiconductor body (10), which comprises a waveguide region (4), wherein the waveguide region (4) comprises a first waveguide layer (2A), a second waveguide layer (2B) and an active layer (3) arranged between the first waveguide layer (2A) and the second waveguide layer (2B) and serving for generating laser radiation (5), and the waveguide region (4) is arranged between a first cladding layer (1A) and a second cladding layer (1B) disposed downstream of the waveguide region (4) in the growth direction of the semiconductor body (10). The waveguide region (4) has a thickness d of 400 nm or less, and an emission angle of the laser radiation (5) emerging from the semiconductor body (10) in a direction parallel to the layer plane of the active layer (3) and the emission angle of the laser radiation (5) emerging from the semiconductor body (10) in a direction perpendicular to the layer plane of the active layer (3) differ from one another by less than a factor of 3.

10 Claims, 4 Drawing Sheets

U.S. PATENT DOCUMENTS

2006/0215723 A1* 9/2006 Watanabe ............ 372/103
2007/0158637 A1 7/2007 Tanaka

FOREIGN PATENT DOCUMENTS

| EP | 1246326 | 10/2002 |
|---|---|---|
| JP | 05-335687 | 12/1993 |
| JP | 2000-012956 | 1/2000 |

OTHER PUBLICATIONS

Nichia Data Sheet No. NDHB510APA—*Nichia Corporation*, P.O. Box 6 Anan, Tokushima-Ken 774-8601, Japan.

Yu Higuchi, et al. "Room Temperature CW Lasing of a GaN-Based Vertical-Cavity Surface-Emitting Laser by Current Injection" *Applied Physics Express* (1), pp. 121102-1-121102-3, 2008.

* cited by examiner

EDGE-EMITTING SEMICONDUCTOR LASER

CROSS-REFERENCE TO RELATED APPLICATIONS

This application is the National Stage of International Application No. PCT/EP2010/055364, filed on Apr. 22, 2010, which claims the priority of German Patent Application No. 10 2009 019 516.5, filed on Apr. 30, 2009. The contents of both applications are hereby incorporated by reference in their entirety.

The invention relates to an edge-emitting semiconductor laser, in particular a semiconductor laser based on a nitride compound semiconductor.

This patent application claims the priority of German patent application 10 2009 019 516.5, the disclosure content of which is hereby incorporated by reference.

Conventional semiconductor lasers based on nitride compound semiconductors are generally optimized toward achieving high output powers. Semiconductor lasers of this type therefore have a characteristic of having a high gradient, that is to say that the output power of the semiconductor laser increases greatly as the operating current intensity increases. Since even small changes in the operating current intensity lead to considerable changes in the output power, the precise driving of a desired output power, in particular of a small output power, is problematic. Furthermore, the operation of a semiconductor laser of this type in an operating current range lying only just above the laser threshold is also difficult. This is based on the fact that, given a constant operating current, even a small, for example aging-governed, rise in the threshold current intensity of the semiconductor laser can have the effect that the threshold current intensity is no longer attained and the semiconductor laser therefore no longer emits coherent laser radiation.

Edge-emitting semiconductor lasers optimized toward a high efficiency at high optical powers generally have comparatively wide waveguide structures that lead to a comparatively small emission angle parallel to the layer plane of the epitaxial layers. By contrast, a semiconductor laser of this type typically has a comparatively large emission angle in a direction perpendicular to the epitaxial layers on account of the diffraction. The laser beam is therefore highly elliptic, and so a complicated and expensive optical system is generally required if the application of the edge-emitting semiconductor laser requires an approximately circular beam profile.

The invention is based on the object of specifying an improved edge-emitting semiconductor laser in which a beam profile having low ellipticity, preferably an almost circular beam profile, is obtained in a comparatively simple manner.

This object is achieved by means of an edge-emitting semiconductor laser comprising the features of patent claim 1. The dependent claims relate to advantageous configurations and developments of the invention.

In accordance with at least one embodiment, an edge-emitting semiconductor laser comprises a semiconductor body comprising a waveguide region, wherein the waveguide region comprises a first waveguide layer, a second waveguide layer and an active layer arranged between the first waveguide layer and the second waveguide layer and serving for generating laser radiation. The waveguide region is arranged between a first cladding layer, which, by way of example, faces a substrate of the edge-emitting semiconductor laser, and a second cladding layer, which, by way of example, is disposed downstream of the waveguide region in the growth direction of the semiconductor body. Therefore, the first cladding layer, the first waveguide layer, the active layer, the second waveguide layer and the second cladding layer preferably succeed one another in the growth direction of the semiconductor body. The semiconductor layers, preferably produced epitaxially, are applied to a substrate, for example, and can be provided with an electrical contact layer on a side lying opposite the substrate.

The waveguide region preferably has a thickness of 400 nm or less. That is to say that the sum of the thicknesses of the first waveguide layer, of the second waveguide layer and of the active layer arranged between the first waveguide layer and the second waveguide layer is not more than 400 nm.

By virtue of the fact that the waveguide region is comparatively thin and preferably has a thickness of less than 400 nm, what is achieved is that the difference between the emission angle in a horizontal direction, that is to say in a direction parallel to the layer plane of the semiconductor layers, and in a vertical direction, that is to say in a direction perpendicular to the layer planes of the semiconductor layers, is reduced by comparison with conventional edge emitting semiconductor lasers. The astigmatism typical of edge emitting semiconductor lasers, that is to say a highly elliptic beam profile, is reduced in this way.

Preferably, the waveguide region has a thickness of 300 nm or less, particularly preferably even 250 nm or less.

In one preferred configuration, the emission angle $\alpha_p$ of the laser radiation emerging from the semiconductor body in a direction parallel to the layer plane of the active layer and the emission angle $\alpha_s$ of the laser radiation emerging from the semiconductor body in a direction perpendicular to the layer plane of the active layer differ from one another by less than a factor of 3. In the context of the application, the emission angles $\alpha_s$, $\alpha_p$ are in each case understood to be the full angle range in which the intensity of the emitted laser radiation is not less than half of the intensity in the main radiation direction (FWHM—Full Width at Half Maximum). Furthermore, the emission angle of the laser radiation emerging from the semiconductor body is understood to be the emission angle at the side facet of the semiconductor laser without taking account of optical elements possibly present for beam shaping, in particular lenses arranged outside the semiconductor body.

In particular, it is possible for the emission angles of the semiconductor laser in a horizontal and a vertical direction to differ from one another by less than a factor of 2. By way of example, the emission angle in a vertical direction, that is to say perpendicular to the layer planes of the semiconductor layers, can be greater than the emission angle in a horizontal direction, that is to say in a direction parallel to the layer planes of the semiconductor layers. In this case, however, the emission angle in a vertical direction is a maximum of three times and preferably not more than twice as much as the emission angle in a horizontal direction.

By virtue of the fact that the emission angles in a horizontal and a vertical direction have only a comparatively small difference, it is possible to use a comparatively cost-effective spherical lens for collimating the laser radiation. Comparatively expensive aspherical lenses, for example cylindrical lenses, can advantageously be dispensed with.

The edge-emitting semiconductor laser can comprise, in particular, a housing containing a lens for the beam shaping of the emitted laser radiation. The preferably spherical lens advantageously simultaneously serves as a covering of the housing and advantageously protects the semiconductor body of the edge-emitting semiconductor laser against mechanical damage or environmental influences such as moisture or dirt.

The housing of the edge-emitting semiconductor laser can be embodied, in particular, as a so-called TO housing (Transistor Outline). This type of housing generally has a plurality of, typically three, connection pins for the electrical contact-connection and mounting of the edge-emitting semiconductor laser. The semiconductor body of the edge-emitting semiconductor laser is arranged under a covering, which can be cylindrical, in particular, on an electrically conductive carrier connected to one of the connection pins. The covering, which is typically at least approximately cylindrical, can be produced from plastic or metal, for example, and can have, on the radiation exit side, a transparent covering embodied preferably as a lens, particularly preferably as a spherical lens.

Alternatively, the semiconductor laser can also comprise an SMT housing (surface mount technology). Surface-mountable housings of this type have, at a housing underside and/or a housing side area, contact areas for electrical contact-connection, at which the housing can be soldered, for example, onto a printed circuit board.

The edge-emitting semiconductor laser has a first and a second side facet, which are preferably provided with a reflection-increasing coating in each case. In one preferred configuration, a first side facet of the semiconductor body, said first side facet serving as a radiation coupling-out area, is provided with a reflection-increasing coating, the reflection of which is preferably 75 percent or more. Particularly preferably, the reflection of the reflection-increasing coating on the first side facet serving as a radiation coupling-out area is even 85 percent or more. It is also possible for the reflection of the reflection-increasing coating to be even 95 percent or more.

By virtue of such a high reflection at the side facet of the semiconductor body which serves as a radiation coupling-out area, the gradient of the characteristic curve of the semiconductor laser is indeed reduced, that is to say that the output power of the semiconductor laser increases to a lesser extent as the operating current increases by comparison with a conventional semiconductor laser wherein the radiation coupling-out area has a lower reflection. This is based on the fact that a larger proportion of the laser radiation impinging upon the side facet of the semiconductor body is reflected back into the resonator and is therefore not coupled out from the semiconductor laser. On the other hand, however, the average circulation time of the laser radiation in the laser resonator also increases in this way as a result of which the threshold current intensity of the semiconductor laser is advantageously reduced.

The low threshold current intensity and the small gradient of the characteristic curve of the semiconductor laser have the advantage that stable operation is ensured even at low output powers of the semiconductor laser. In particular, relatively small changes in the operating current intensity bring about only small changes in the optical output power, and the risk of the threshold current intensity being undershot in the case of fluctuations in the operating current intensity is comparatively low on account of the low threshold current intensity. In particular, the operating currents in normal operation are so far above the threshold current intensity of the semiconductor laser that an aging-governed rise that possibly occurs in the threshold current intensity generally does not have the effect that the laser threshold is no longer attained and that the laser activity stops.

In a further preferred embodiment, a monitor diode is disposed downstream of a second side facet of the semiconductor laser, said second side facet lying opposite the radiation coupling-out area. The second side facet, lying opposite the first side facet serving as a radiation coupling-out area, typically has a comparatively high reflection of preferably 85 percent or more, or particularly preferably 95 percent or more. Nevertheless, at least a small proportion of the laser radiation can emerge from the semiconductor body at the side facet lying opposite the radiation coupling-out area and can be fed to a monitor diode for monitoring the optical output power of the semiconductor laser. The monitor diode is preferably connected to a control loop, by means of which the optical output power is kept constant.

The increase in the reflection of the first side facet serving as the radiation coupling-out area has the abovementioned advantages of a reduction of the threshold current intensity and a reduction of the gradient of the characteristic curve of the semiconductor laser. Furthermore, it is also advantageously possible to reduce the resonator length in comparison with a conventional semiconductor laser. In particular, it has been found that a shortening of the length of the laser resonator from a length $L_a$ to a length $L_b$ can be compensated for by increasing the reflectivity of the first side facet $R_{1,a}$ serving as a radiation coupling-out area to a value $R_{1,b}$. In this case, the compensation of the reduced resonator length by an increased reflection $R_{1,b}$ of the first side facet is effected according to the following equation:

$$R_{1,b} = \frac{1}{R_{2,a} * \exp\left(\frac{L_b}{L_a} * \ln\left[\frac{1}{R_{2,a} * R_{1,a}}\right]\right)}$$

In this case, $R_{2,a}$ is the reflection of the second side facet, which lies opposite the first side facet serving as a radiation coupling-out area.

The shortening of the resonator of the edge-emitting semiconductor laser has the advantage that it is possible to produce a larger number of laser diodes on a wafer, as a result of which the production costs are advantageously reduced.

Advantageously, the length of the laser resonator of the edge-emitting semiconductor laser is not more than 450 μm.

On account of the comparatively low threshold current intensity and the small gradient of the characteristic curve, the edge-emitting semiconductor laser is suitable, in particular, for operation at low output powers. Preferably, the optical output power is 10 mW or less. In particular, stable operation can also be realized at output powers of 5 mW or less. The edge-emitting semiconductor laser is therefore of importance, in particular, for applications in which stable operation with low output powers is intended to be achieved in a cost-effective manner, for example in the case of a laser pointer.

The edge-emitting semiconductor laser can be, in particular, a semiconductor laser which emits laser radiation in the wavelength range of 430 nm to 700 nm.

Preferably, the semiconductor laser emits in the blue or blue-green range of the visible spectrum. In particular, the emitted laser radiation can have an intensity maximum at a wavelength of between 430 nm and 540 nm. The semiconductor laser can be, for example, a constituent part of a laser pointer having a wavelength in the blue spectral range (<500 nm) or having a wavelength in the green spectral range (>500 nm).

A semiconductor laser of this type can be based on a nitride compound semiconductor, for example. In the present context, "based on a nitride compound semiconductor" means that the semiconductor layer sequence or at least one layer thereof comprises a III nitride compound semiconductor material, preferably $In_xAl_yGa_{1-x-y}N$, where $0 \leq x \leq 1$, $0 \leq y \leq 1$ and $x+y \leq 1$. In this case, this material need not necessarily have a mathematically exact composition according to the above formula. Rather, it can comprise one or a plurality of dopants such as, for example, Mg or Si and additional constituents which substantially do not change the characteristic physical properties of the $In_xAl_yGa_{1-x-y}N$ material. For the sake of simplicity, however, the above formula only includes the essential constituents of the crystal lattice (In, Al, Ga, N), even if these can be replaced in part by small amounts of further substances.

The invention is explained in greater detail below on the basis of exemplary embodiments in association with FIGS. 1 to 5.

In the figures:

Identical or identically acting constituent parts are provided with the same reference symbols in the figures. The illustrated constituent parts and also the size relationships of the constituent parts with respect to one another should not be regarded as true to scale.

Figure 1A:
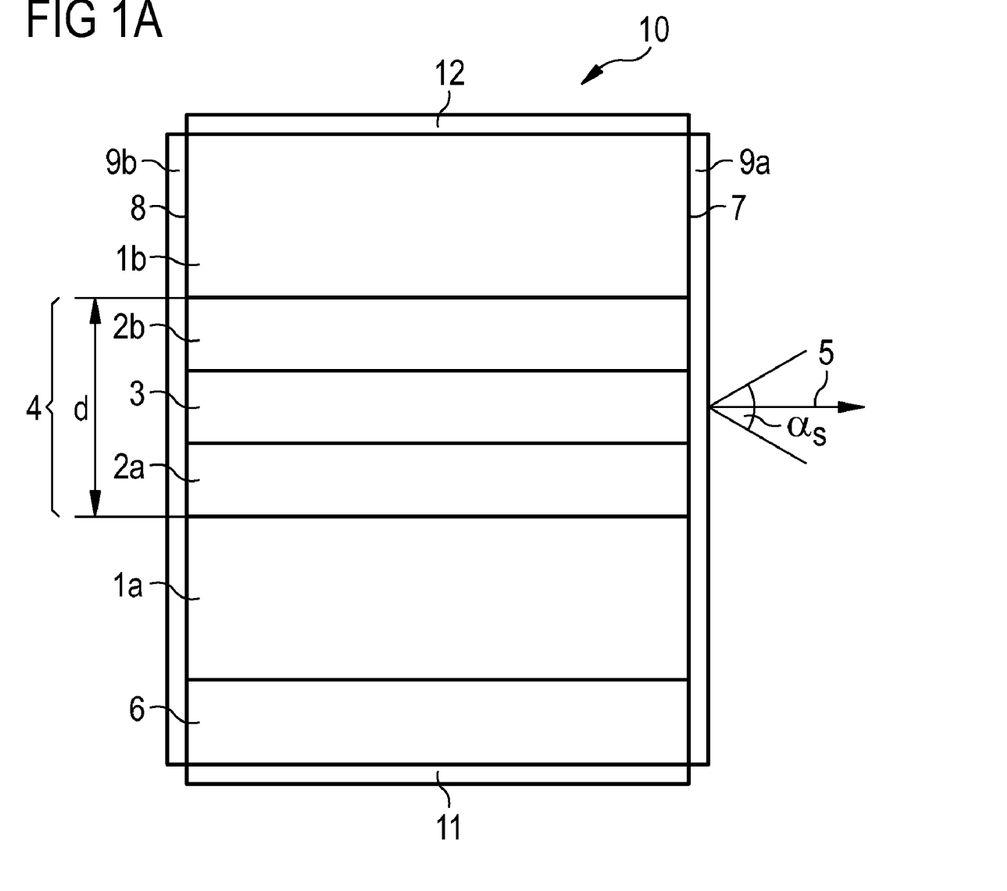
FIG. 1A shows a schematic illustration of a cross section through an exemplary embodiment of an edge-emitting semiconductor laser.
Figure 1B:
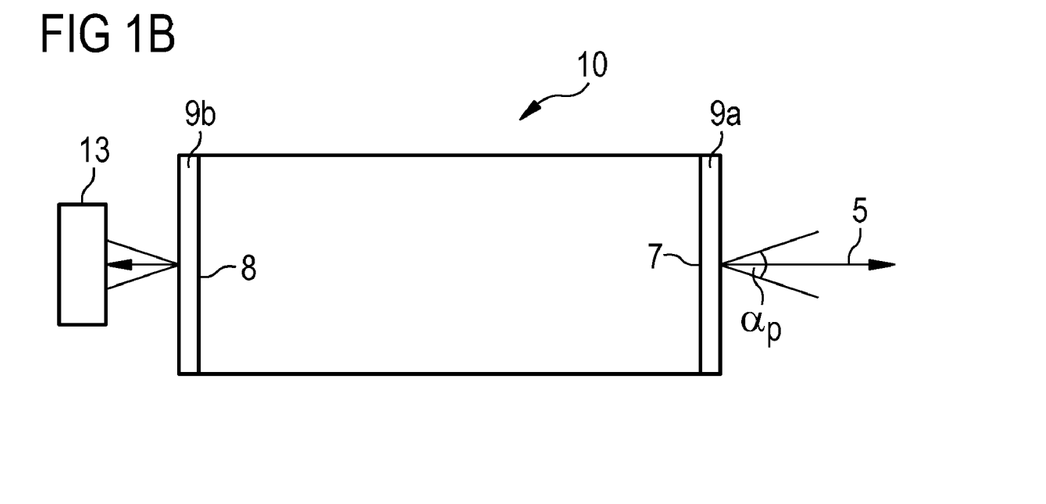
FIG. 1B shows a schematic illustration of a plan view of the exemplary embodiment illustrated in FIG. 1A.

FIGS. 1A and 1B illustrate an exemplary embodiment of an edge-emitting semiconductor laser in a cross section and in a plan view.

The edge-emitting semiconductor laser comprises a semiconductor body 10 containing a waveguide region 4. The waveguide region 4 comprises a first waveguide layer 2a, a second waveguide layer 2b and an active layer 3 arranged between the first waveguide layer 2a and the second waveguide layer 2b and serving for generating laser radiation 5.

The active layer 3 of the edge-emitting semiconductor laser can be, in particular, a single or multiple quantum well structure. In the context of the application, the designation quantum well structure encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

The waveguide region 4 is arranged between a first cladding layer 1a and a second cladding layer 1b disposed downstream of the waveguide region 4 in the growth direction of the semiconductor body 10. The first cladding layer 1a is therefore arranged on a side facing a substrate 6 of the semiconductor body 10, and the second cladding layer 1b is arranged on a side of the semiconductor body 10 which is remote from the active layer 3 as seen from the substrate 6. Preferably, the semiconductor layers 1b, 2b arranged above the active layer form a p-doped region and the layers 1a, 2a arranged below the active layer 3 form an n-doped region.

The semiconductor body 10 of the edge-emitting semiconductor laser is preferably based on a nitride compound semiconductor. Nitride compound semiconductors are suitable, in particular, for generating radiation in the blue and blue-green spectral range. The emission wavelength of the edge-emitting semiconductor laser can lie, in particular, in the range of approximately 430 nm to 540 nm.

The electrical contact-connection of the edge-emitting semiconductor laser is effected, for example, by means of a first electrical contact layer 11 at the rear side of the substrate 6, said rear side being remote from the active layer 3, and a second electrical contact layer 12 at a surface of the semiconductor body 10 which lies opposite the substrate 6.

The semiconductor body 10 can contain one or more further layers in addition to the semiconductor layers illustrated in FIG. 1A. By way of example, one or more intermediate layers can be arranged between the substrate 6 and the lower cladding layer 1a or between the upper cladding layer 1b and the second contact layer 12. Furthermore, it is also possible for one or more of the above-described semiconductor layers of the semiconductor body 10 to be composed of a plurality of partial layers instead of one individual layer. In particular, for example, the active layer 3 can be formed from a quantum well structure comprising a plurality of quantum layers arranged between barrier layers. Furthermore, it is also possible, for example, for a partial layer having an increased electronic band gap to be embedded (not illustrated) into the second waveguide layer 2b, said partial layer acting as an electron barrier and leading to a better charge carrier confinement in the active layer 3.

The cladding layers 1a, 1b advantageously have a lower refractive index than the waveguide layers 2a, 2b, as a result of which the laser radiation 5 propagating in a lateral direction is substantially confined in the waveguide region 4. The laser modes propagating in the waveguide region 4 formed from the active layer 3, the first waveguide layer 2a and the second waveguide layer 2b therefore penetrate only slightly into the cladding layers 1a, 1b.

The laser resonator of the edge-emitting semiconductor laser is formed by the side facets 7, 8 of the semiconductor body 10. The side facets 7, 8 are preferably provided with a reflection-increasing coating 9a, 9b in each case. The reflection-increasing coatings 9a, 9b can be formed, for example, from a multiplicity of alternating dielectric layers. In particular, the reflection-increasing coatings 9a, 9b can in each case comprise a multiplicity of layer pairs composed of oxide layers having different refractive indices, such as, for example, silicon dioxide having a comparatively low refractive index and tantalum pentoxide having a comparatively high refractive index. Alternatively, however, it would also be possible for the reflection-increasing coatings 9a, 9b to be formed from alternating semiconductor layers having different refractive indices.

In the edge-emitting semiconductor laser, the first side facet 7 serves as a radiation coupling-out area. The laser radiation 5 is therefore emitted from the semiconductor body 10 through the first side facet 7 with the reflection-increasing coating 9a preferably applied thereon, wherein the main radiation direction of the laser radiation 5 is oriented perpendicular to the side facet 7 of the semiconductor body 10. In order that part of the laser radiation propagating in the laser resonator formed from the first side facet 7 and the second side facet 8 is coupled out from the semiconductor body 10 at the first side facet 7, the reflection-increasing coating 9a of the first side facet 7 preferably has a lower reflection R than the reflection-increasing coating 9b of the second side facet 8.

On account of diffraction effects, the entire laser radiation 5 is not emitted perpendicularly to the radiation coupling-out area, rather it has a beam cone having an emission angle $\alpha_s$, $\alpha_p$. In the case of a conventional semiconductor laser, the emission angle $\alpha_s$ in a direction perpendicular to the layer plane of the active layer is considerably greater than the emission angle $\alpha_p$ in the direction parallel to the layer plane of the active layer. In the context of the application, the emission angles $\alpha_s$, $\alpha_p$ are understood to be in each case the full angle range in which the intensity of the emitted laser radiation 5 is not less than half of the intensity maximum.

It has advantageously been found that the difference between the emission angle $\alpha_s$ in a direction perpendicular to the layer plane of the active layer 3 and the emission angle $\alpha_p$ in a direction parallel to the layer plane of the active layer 3 can be reduced by reducing the thickness d of the waveguide region 4. The waveguide region 4 preferably has a thickness d of 400 nm or less, particularly preferably of 300 nm or less.

What is achieved in this way is that the emission angle $\alpha_s$ perpendicular to the layer plane of the active layer 3 and the emission angle $\alpha_p$ parallel to the plane of the active layer 3 differ from one another preferably by less than a factor of 3 and particularly preferably by less than a factor of 2.

Figure 2:
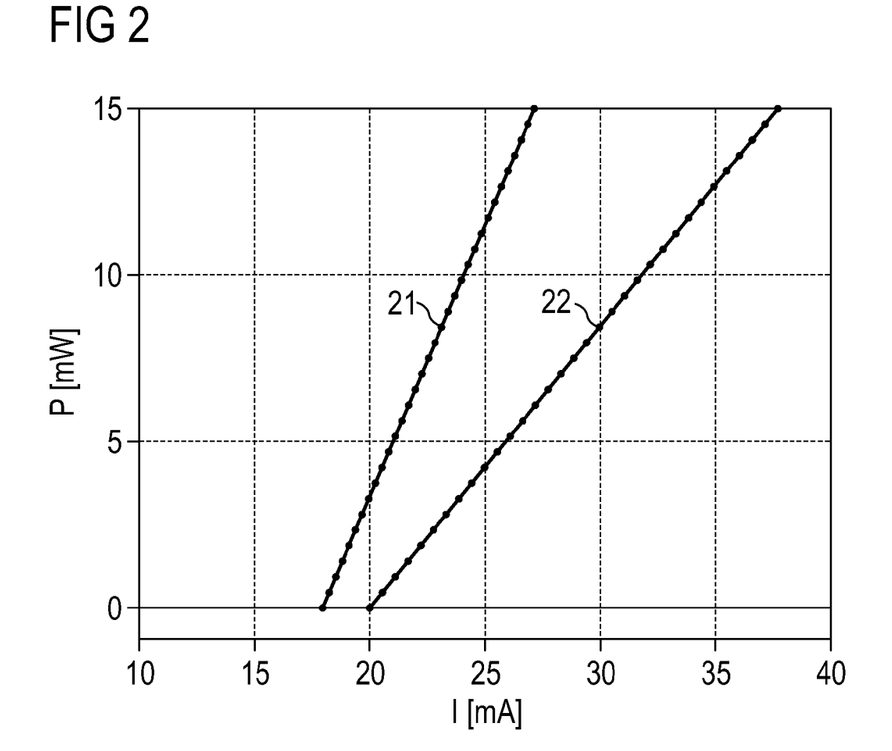
FIG. 2 shows a graphical illustration of the optical output power as a function of the operating current intensity for two exemplary embodiments of semiconductor lasers having different thicknesses of the waveguide region.

FIG. 2 illustrates the influence of the thickness d of the waveguide region 4 on the characteristic curve of the edge-emitting semiconductor laser. The illustration shows the optical output power P as a function of the operating current intensity I for an edge-emitting semiconductor laser wherein the thickness d of the waveguide region 4 is 600 nm (curve 21) in comparison with an edge-emitting semiconductor laser wherein the thickness d of the waveguide region 4 is advantageously only 250 nm (curve 22). In both exemplary embodiments, the reflectivity at the first side facet 7, which is identical to the radiation coupling-out area, is in each case 50 percent and the reflectivity at the second side facet 8 is in each case 95 percent. The characteristic curve 22 of the edge-emitting semiconductor laser having an advantageously small thickness of the waveguide region 4 of only 250 nm has a smaller gradient than the characteristic curve 21 of the edge-emitting semiconductor laser having a thickness d of the waveguide region 4 of 600 nm. The smaller gradient of the characteristic curve, which arises as a result of the reduction of the thickness of the waveguide region 4, is admittedly disadvantageous if a high output power of the semiconductor laser is desired. On the other hand, however, the shallower characteristic curve 22 has the advantage that comparatively small output powers, in particular output powers of 10 mW or less, can be set more precisely by means of the setting of the operating current intensity I. The semiconductor laser having the shallower characteristic curve 22 is advantageously also less sensitive to external influences such as, for example, a temperature change or an aging-governed shift in the threshold current intensity.

The edge-emitting semiconductor laser having a thickness d of the waveguide region 4 of 600 nm has an emission angle $\alpha_p$ in the direction parallel to the layer plane of the active layer 3 of approximately 8.3 degrees. In the direction perpendicular to the layer plane of the active layer 3, the emission angle $\alpha_s$ is approximately 22.4 degrees. Consequently, the ratio of the emission angle $\alpha_s$ to the emission angle $\alpha_p$ is approximately 2.7. By contrast, the edge-emitting semiconductor laser having the characteristic curve 22 and a thickness d of the waveguide region 4 of 250 nm has an emission angle $\alpha_p$ of 11.9 degrees and an emission angle $\alpha_s$ of approximately 18.6 degrees. On account of the reduction of the thickness d of the waveguide region, therefore, the ratio of the emission angle $\alpha_s$ to the emission angle $\alpha_p$ is only approximately 1.57. The edge-emitting semiconductor laser having the reduced thickness d of the waveguide region 4 therefore advantageously has a less elliptic beam profile than the semiconductor laser having the larger thickness d of the waveguide region.

The low ellipticity of the beam profile of the semiconductor laser on account of the comparatively small thickness of the waveguide region 4 has the advantage that it is possible to use comparatively simple and cost-effective optical elements for beam shaping. In contrast thereto, in the case of conventional semiconductor lasers optimized toward high powers, complicated aspherical lenses or lens systems are often used in order to adapt the beam divergence in the direction parallel and perpendicular to the semiconductor layers to one another. In the case of the edge-emitting semiconductor laser described herein, preferably only a single lens is used for beam shaping. The lens is preferably a spherical lens that can be produced simply and cost-effectively.

Figure 3:
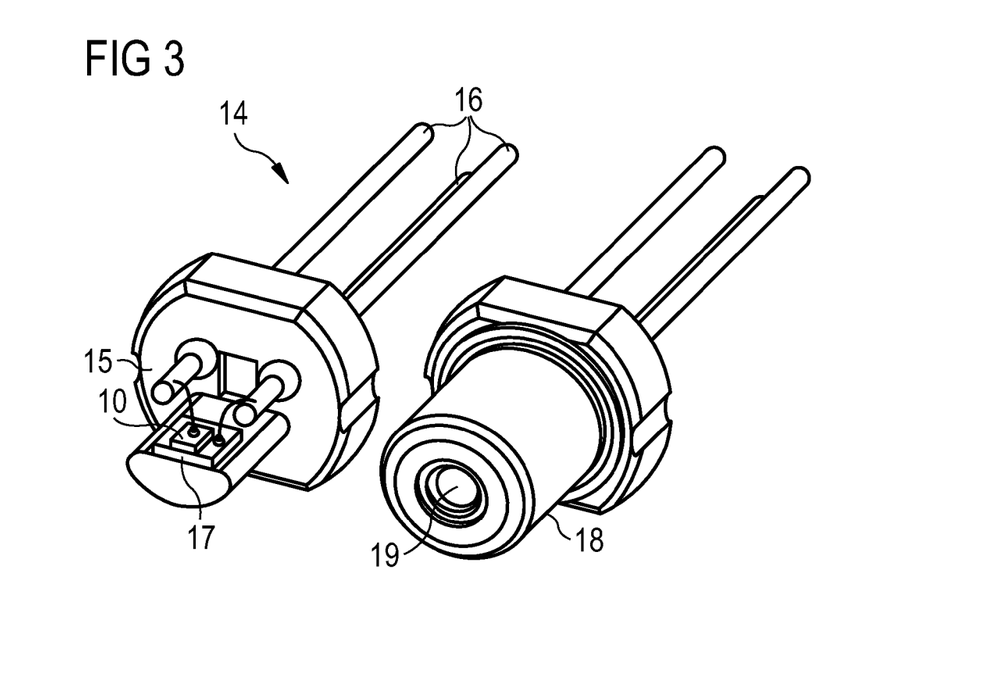
FIG. 3 shows in each case a perspective illustration of an exemplary embodiment of an edge emitting semiconductor laser without a housing covering (left) and with a housing covering (right)

The preferably spherical lens can be integrated into a housing of the edge-emitting semiconductor laser. An exemplary embodiment of the edge-emitting semiconductor laser comprising a so-called TO-housing (transistor outline) is illustrated in FIG. 3. The housing is illustrated with a housing covering 18 in the right-hand half of FIG. 3 and without the housing covering in the left-hand half of FIG. 3 for clarification purposes. The housing 14 comprises a housing base body 15, from which project three connection pins 16 serving for the mounting and electrical contact-connection of the edge-emitting semiconductor laser. The semiconductor body 10 is advantageously mounted onto a heat sink 17, via which the heat loss of the semiconductor body 10 is dissipated. For electrical contact-connection, the semiconductor body 10 is electrically conductively connected to two connection pins 16 of the housing by means of bonding wires. The semiconductor body 10 is mounted perpendicularly in the housing, such that the main emission direction of the laser radiation is effected perpendicularly to the housing base body 15 of the housing 14. As is illustrated in the right-hand half of FIG. 3, the housing 14 preferably has a housing covering 18, into which is integrated, in the beam direction of the semiconductor body 10, a lens 19 for the beam shaping of the laser radiation. The lens 19 can be, in particular, a spherical lens that can be produced simply and cost-effectively.

FIG. 2, which has already been explained above, reveals that the edge-emitting semiconductor laser having the characteristic curve 22 and a thickness d of the waveguide region 4 of only 250 nm has a greater threshold current intensity than the edge-emitting semiconductor laser having the steeper characteristic curve 21 and the comparatively thick waveguide region 4 having a thickness of 600 nm. The increase in the threshold current intensity as a result of the reduction in the thickness of the waveguide region 4 can be counteracted by increasing the reflectivity of the first side facet 7 of the semiconductor laser, which serves as a radiation coupling-out area. This is explained below on the basis of the characteristic curves of edge-emitting semiconductor lasers having reflectivities of the first side facet which have different magnitudes, as illustrated in FIGS. 4 and 5.

Figure 4:
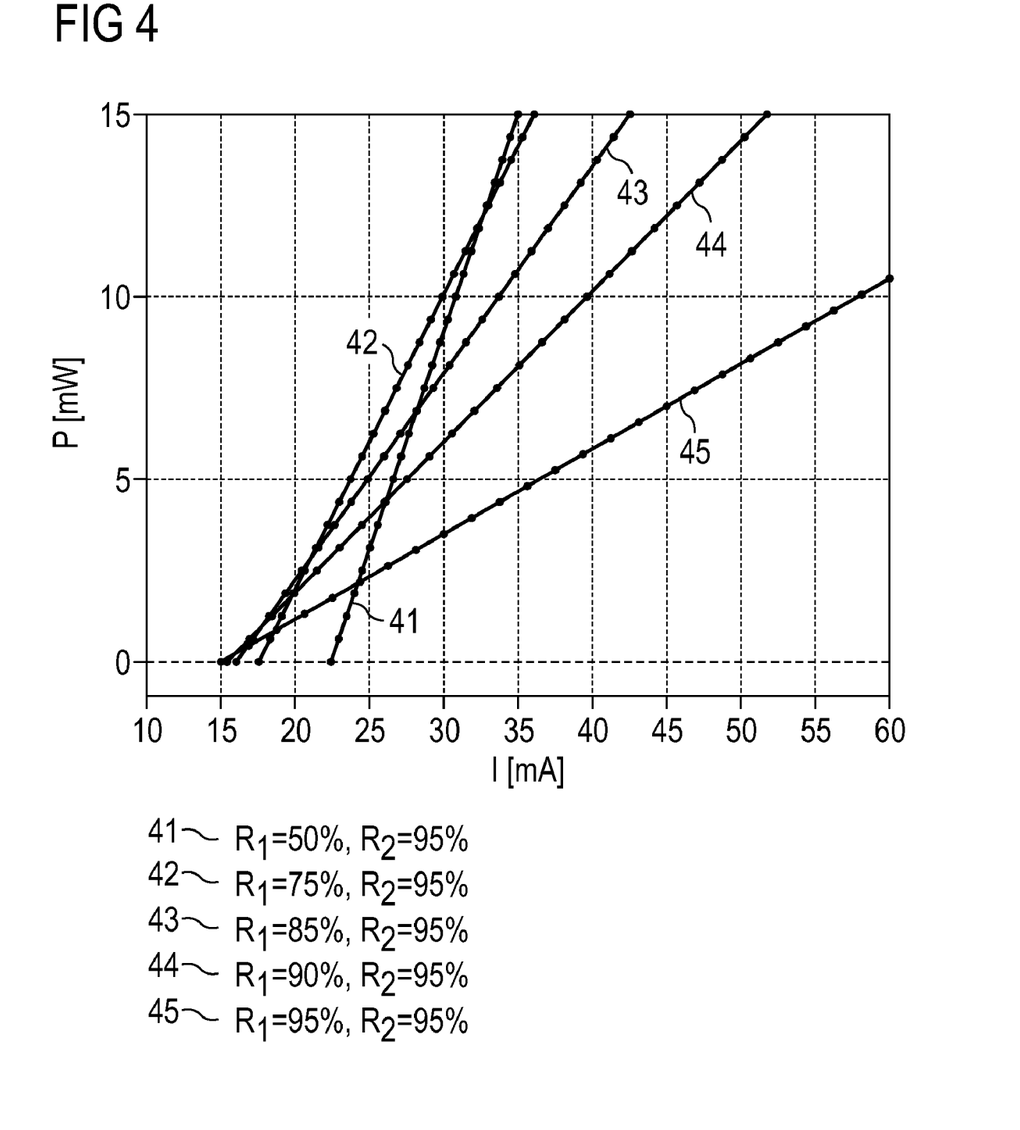
FIG. 4 shows a graphical illustration of the optical output power as a function of the operating current for five exemplary embodiments of edge-emitting semiconductor lasers having reflectivities of the radiation coupling-out area which have different magnitudes.

FIG. 4 shows a graphical illustration of the optical output power P as a function of the operating current intensity I for exemplary embodiments of edge-emitting semiconductor lasers wherein the reflectivity $R_1$ of the first side facet serving as a radiation coupling-out area is 50 percent (curve 41), 75 percent (curve 42), 85 percent (curve 43), 90 percent (curve 44) and 95 percent (curve 45). The reflectivity $R_2$ of the second side facet of the semiconductor laser is 95 percent in all cases. The reflectivity $R_1$ of the first side facet can be altered, in particular by changing a reflection-increasing coating applied to the first side facet of the semiconductor laser. In particular, the material combination or the number of the alternating layers of a dielectric mirror can be altered in order to set a desired reflectivity.

FIG. 4 illustrates that the gradient of the characteristic curves decreases with increasing reflectivity at the radiation coupling-out area and the threshold current intensity simultaneously decreases. A small gradient of the characteristic curve and a low threshold current intensity have the advantage that a desired optical output power can be set precisely by means of the regulation of the operating current intensity, and that an increase in the threshold current intensity, which can arise as a result of aging effects of the semiconductor laser, does not lead to failure of semiconductor laser since operation takes place even at low output powers with operating current intensities lying significantly above the laser threshold. Advantageously, the reflectivity $R_1$ of the reflection-increasing coating of the first side facet of the semiconductor laser is at least 75 percent. Particularly preferably, the reflectivity $R_1$ of the first side facet is at least 85 percent, and particularly preferably at least 90 percent.

Figure 5:
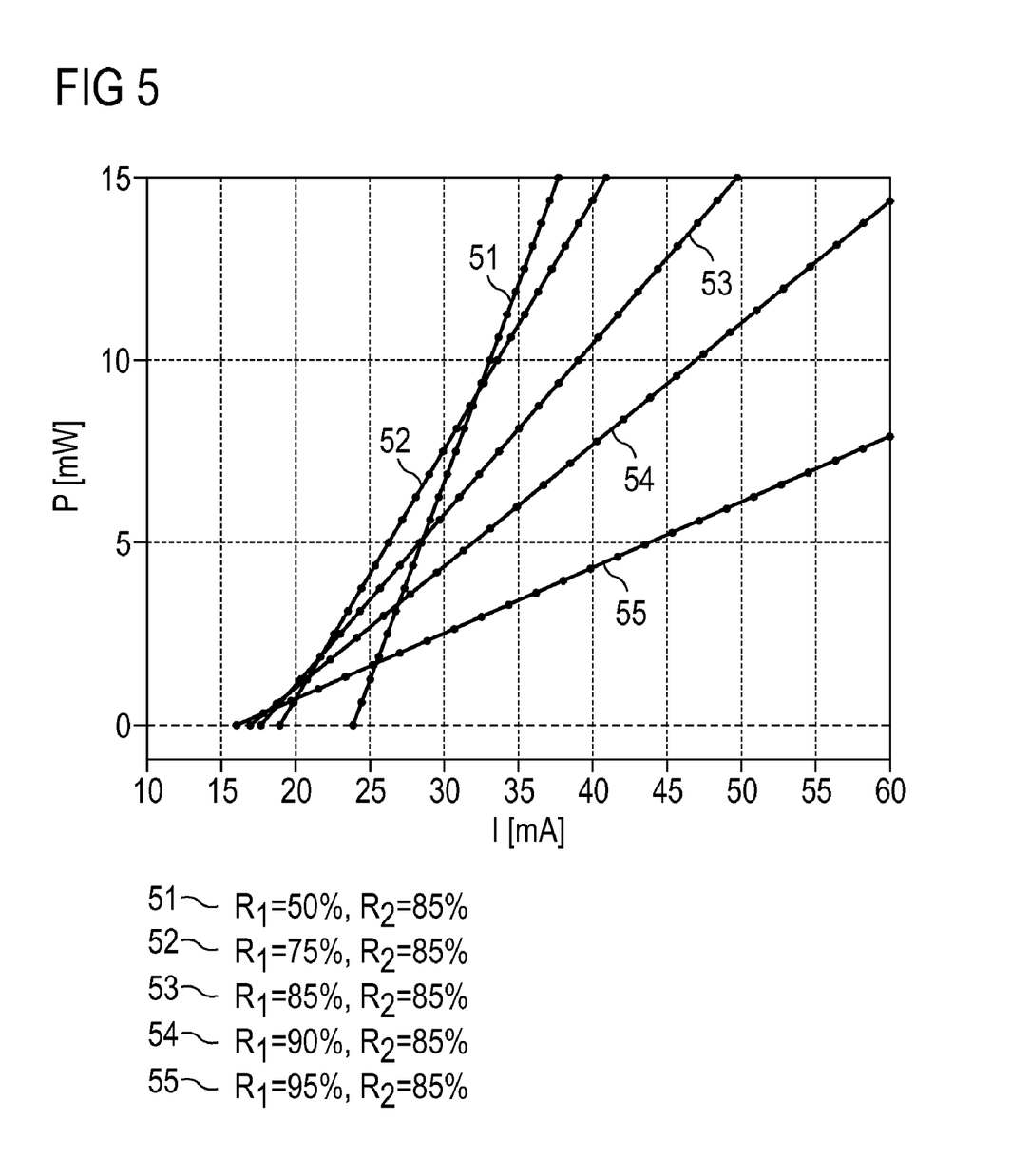
FIG. 5 shows a graphical illustration of the optical output power as a function of the operating current for a further five exemplary embodiments of semiconductor lasers having reflectivities of the radiation coupling-out area which have different magnitudes.

FIG. 5 illustrates the optical output power P as a function of the operating current intensity I for five further exemplary embodiments of edge-emitting semiconductor lasers when the reflectivity $R_1$ at the first side facet is 50 percent (curve 51), 75 percent (curve 52), 85 percent (curve 53), 90 percent (curve 54) and 95 percent (curve 55). In contrast to the exemplary embodiments illustrated in FIG. 4, the reflectivity $R_2$ of the second side facet of the semiconductor laser is not 95 percent, but rather only 85 percent. Like the characteristic curves illustrated in FIG. 4, the characteristic curves illustrated in FIG. 5 also show that with increasing reflectivity $R_1$ of the first side facet, which serves as a radiation coupling-out area, the gradient of the characteristic curves decreases and the threshold current intensity decreases.

A lower reflectivity $R_2$ of the second side facet of the semiconductor laser, said second side facet lying opposite the radiation coupling-out area, can be used, for example, to couple out at the second side facet of the semiconductor laser a small proportion of the laser radiation for a monitor diode. By way of example, as illustrated in FIG. 1B, a monitor diode 13 can be disposed downstream of the second side facet 8 of the semiconductor laser. By means of the monitor diode 13, it is possible to ascertain changes in the optical output power that are caused by external influences such as, for example, temperature changes or by aging of the semiconductor laser. The monitor diode 13 is preferably connected to an electrical control loop, which readjusts the operating current intensity in order to obtain a desired optical output power.

An increase in the reflectivity $R_1$ of the first side facet 7 of the semiconductor laser, said first side facet serving as a radiation coupling-out area, has the advantage that the resonator length of the semiconductor laser can be reduced for the same operating current intensity, without the laser threshold being undershot in the process. In particular, a shortening of the resonator length from an original resonator length $L_a$ to a resonator length $L_b$ can be compensated for by increasing the reflectivity $R_{1,b}$ of the first side facet 7 relative to the original reflectivity $R_{1,a}$ of the first side facet 7 of the semiconductor laser as follows:

$$R_{1,b} = \frac{1}{R_{2,a} * \exp\left(\frac{L_b}{L_a} * \ln\left[\frac{1}{R_{2,a} * R_{1,a}}\right]\right)}$$

The reduction of the resonator length of the semiconductor laser makes it possible to manufacture a larger number of semiconductor lasers on a wafer, as a result of which the production costs are advantageously reduced. Preferably, the length of the laser resonator is 450 μm or less.

The edge-emitting semiconductor laser described herein is advantageously used in applications wherein a low output power of, for example, 10 mW or less, preferably 5 mW or less is sufficient, but stable operation over the lifetime of the component and a cost-effective production method are desired.

The invention is not restricted by the description on the basis of the exemplary embodiments. However, the invention encompasses any novel feature and also any combination of features, which in particular includes any combination of features in the patent claims even if this feature or this combination itself is not explicitly specified in the patent claims or exemplary embodiments.

The invention claimed is:

1. An edge-emitting semiconductor laser comprising a semiconductor body, which comprises a waveguide region, wherein the waveguide region comprises a first waveguide layer, a second waveguide layer and an active layer arranged between the first waveguide layer and the second waveguide layer and serving for generating laser radiation, the waveguide region is arranged between a first cladding layer and a second cladding layer disposed downstream of the waveguide region in the growth direction of the semiconductor body, wherein the waveguide region has a thickness d of 400 nm or less, and an emission angle $\alpha_p$ of the laser radiation emerging from the semiconductor body in a direction parallel to the layer plane of the active layer and the emission angle $\alpha_s$ of the laser radiation emerging from the semiconductor body in a direction perpendicular to the layer plane of the active layer differ from one another by less than a factor of 3, the semiconductor body further comprising a first side facet that is a radiation coupling-out area with a reflection-increasing coating with a reflection of 95% or more; and said laser comprising a laser resonator having a length of 450 μm or less.

2. The edge-emitting semiconductor laser according to claim 1, wherein the waveguide region has a thickness d of 300 nm or less.

3. The edge-emitting semiconductor laser according to claim 1, wherein the emission angle $\alpha_s$ and the emission angle $\alpha_p$ differ from one another by less than a factor of 2.

4. The edge-emitting semiconductor laser according to claim 1, which comprises a lens for beam shaping of the laser radiation.

5. The edge-emitting semiconductor laser according to claim 4, wherein the lens is a spherical lens.

6. The edge-emitting semiconductor laser according to claim 4, wherein the lens is contained in a housing of the semiconductor laser.

7. The edge-emitting semiconductor laser according to claim 6, wherein the housing is a TO housing or an SMT housing.

8. The edge-emitting semiconductor laser according to claim 1, wherein a monitor diode is disposed downstream of a second side facet of the semiconductor laser, said second side facet lying opposite the radiation coupling-out area.

9. The edge-emitting semiconductor laser according to claim 1, which has an optical output power of 10 mW or less.

10. The edge-emitting semiconductor laser according to claim 1, wherein the emitted laser radiation has an intensity maximum at a wavelength of between 430 nm and 540 nm.

* * * * *